(12) United States Patent
Lee et al.

(10) Patent No.: US 11,159,153 B2
(45) Date of Patent: Oct. 26, 2021

(54) DATA BUS INVERSION (DBI) ON PULSE AMPLITUDE MODULATION (PAM) AND REDUCING COUPLING AND POWER NOISE ON PAM-4 I/O

(71) Applicant: NVIDIA Corp., Santa Clara, CA (US)

(72) Inventors: Donghyuk Lee, Cedar Park, TX (US); James Michael O'Connor, Austin, TX (US); John Wilson, Wake Forest, NC (US)

(73) Assignee: NVIDIA Corp., Santa Clara, CA (US)

( * ) Notice: Subject to any disclaimer, the term of this patent is extended or adjusted under 35 U.S.C. 154(b) by 229 days.

(21) Appl. No.: 16/295,886

(22) Filed: Mar. 7, 2019

(65) Prior Publication Data

US 2019/0305765 A1    Oct. 3, 2019

Related U.S. Application Data

(60) Provisional application No. 62/650,168, filed on Mar. 29, 2018.

(51) Int. Cl.
| | |
|---|---|
| *H03K 7/02* | (2006.01) |
| *G06F 13/42* | (2006.01) |
| *H04B 14/02* | (2006.01) |
| *H03M 5/00* | (2006.01) |
| *H04L 27/04* | (2006.01) |
| *H04L 27/06* | (2006.01) |
| *H04L 25/06* | (2006.01) |

(52) U.S. Cl.
CPC ........... *H03K 7/02* (2013.01); *G06F 13/4282* (2013.01); *H03M 5/00* (2013.01); *H04B 14/023* (2013.01); *H04L 25/06* (2013.01); *H04L 27/04* (2013.01); *H04L 27/06* (2013.01)

(58) Field of Classification Search
CPC ..... H03M 5/00; H03K 7/02; H03K 19/17724; H04B 14/023; Y02D 10/00; G06F 13/4282; H04L 27/04; H04L 25/06; H04L 25/3927; H04L 27/06
USPC ........ 341/55, 50, 56, 51; 375/286, 288, 260, 375/246, 287; 713/300
See application file for complete search history.

(56) References Cited

U.S. PATENT DOCUMENTS

| | | | |
|---|---|---|---|
| 4,623,223 | A | 11/1986 | Kempf |
| 4,667,337 | A | 5/1987 | Fletcher |
| 4,739,323 | A | 4/1988 | Miesterfeld et al. |
| 4,742,349 | A | 5/1988 | Miesterfeld et al. |
| 5,377,020 | A | 12/1994 | Smitt |

(Continued)

FOREIGN PATENT DOCUMENTS

| | | | |
|---|---|---|---|
| DE | 102019108205 A1 | 10/2019 | |
| DE | 102019118340 A1 * | 1/2020 | ............ H03M 5/14 |

(Continued)

OTHER PUBLICATIONS

Acquaviva, Andrea, et al., A Spatially-Adaptive BusInterface for Low-Switching Communication, ISLPED '00, pp. 238-240, Rapallo, Italy., Feb. 2020.

(Continued)

*Primary Examiner* — Arnold M Kinkead
(74) *Attorney, Agent, or Firm* — Rowan TELS LLC

(57) ABSTRACT

Mechanisms to reduce noise and/or energy consumption in PAM communication systems, utilizing conditional symbol substitution in each burst interval of a multi-data lane serial data bus.

19 Claims, 10 Drawing Sheets

(56) References Cited

U.S. PATENT DOCUMENTS

| | | |
|---|---|---|
| 5,487,665 A | 1/1996 | Lechner et al. |
| 5,572,736 A | 11/1996 | Curran |
| 5,833,340 A | 11/1998 | Yoshikawa et al. |
| 5,856,980 A | 1/1999 | Doyle |
| 5,890,005 A | 3/1999 | Lindholm |
| 6,046,943 A | 4/2000 | Walker |
| 6,285,300 B1 | 9/2001 | Colon-Bonet |
| 6,335,718 B1 | 1/2002 | Hong et al. |
| 6,348,915 B1 | 2/2002 | Yamashita et al. |
| 6,400,633 B1 | 6/2002 | Al-Shamma et al. |
| 6,442,077 B2 | 8/2002 | Shin |
| 6,489,900 B2 | 12/2002 | Shin et al. |
| 6,604,120 B1 | 8/2003 | De |
| 6,877,050 B2 | 4/2005 | Kanzaki et al. |
| 7,022,736 B2 | 4/2006 | Neuner et al. |
| 7,061,408 B2 | 6/2006 | Poechmueller |
| 7,082,489 B2 | 7/2006 | Yeh et al. |
| 7,149,955 B1 | 12/2006 | Sutardja et al. |
| 7,188,263 B1 | 3/2007 | Rubinstein et al. |
| 7,356,632 B2 | 4/2008 | Yeh et al. |
| RE40,864 E | 7/2009 | Hong et al. |
| 7,620,116 B2 | 11/2009 | Bessios et al. |
| 7,782,682 B2 | 8/2010 | Matsuzaki et al. |
| 8,022,726 B2 | 9/2011 | Candage et al. |
| 8,022,736 B2 | 9/2011 | Chang et al. |
| 8,181,101 B2 | 5/2012 | Shen et al. |
| 8,189,263 B1 | 5/2012 | Wang et al. |
| 8,359,498 B1 | 1/2013 | Sutardja et al. |
| 8,984,380 B2 | 3/2015 | Vijayaraghavan et al. |
| 9,184,906 B1 | 11/2015 | Min et al. |
| 9,231,704 B1 | 1/2016 | Zhou et al. |
| 9,240,907 B2 | 1/2016 | Wang |
| 9,244,763 B1 | 1/2016 | Kankani et al. |
| 9,548,858 B1 | 1/2017 | Cirit et al. |
| 9,564,990 B1 | 2/2017 | Tiruvur et al. |
| 9,853,769 B1 | 12/2017 | Farjad et al. |
| 9,942,063 B2 | 4/2018 | Mendel |
| 10,312,896 B2 | 6/2019 | Kim et al. |
| 2003/0035497 A1 | 2/2003 | Gorecki et al. |
| 2003/0108134 A1 | 6/2003 | Stonick et al. |
| 2004/0114692 A1 | 6/2004 | Matsumoto |
| 2005/0086417 A1 | 4/2005 | Meyer et al. |
| 2005/0089126 A1 | 4/2005 | Zerbe et al. |
| 2005/0185281 A1 | 8/2005 | Perlin et al. |
| 2006/0109917 A1 | 5/2006 | Fonseka et al. |
| 2006/0139186 A1 | 6/2006 | Hoyer |
| 2006/0280272 A1 | 12/2006 | Stojanovic |
| 2007/0203962 A1 | 8/2007 | Hirairi |
| 2008/0181331 A1 | 7/2008 | Casper et al. |
| 2008/0262855 A1 | 10/2008 | Mehrotra et al. |
| 2009/0193319 A1 | 7/2009 | Shen et al. |
| 2009/0323722 A1 | 12/2009 | Sharma |
| 2010/0174844 A1 | 7/2010 | Chu |
| 2010/0214138 A1* | 8/2010 | Hollis ............... G11C 7/1006 341/55 |
| 2010/0299440 A1 | 11/2010 | Meyer et al. |
| 2011/0264719 A1 | 10/2011 | Mortensen |
| 2012/0110255 A1 | 5/2012 | Meyer et al. |
| 2012/0144161 A1 | 6/2012 | Elliott |
| 2012/0204082 A1 | 8/2012 | Shen et al. |
| 2012/0206280 A1 | 8/2012 | Abbasfar et al. |
| 2012/0250746 A1 | 10/2012 | Sonntag |
| 2013/0226982 A1 | 8/2013 | Yu |
| 2014/0153620 A1 | 6/2014 | Longo et al. |
| 2014/0173296 A1 | 6/2014 | Muff et al. |
| 2014/0281075 A1 | 9/2014 | Hollis |
| 2014/0298458 A1 | 10/2014 | Lewis et al. |
| 2014/0358979 A1 | 12/2014 | Singh |
| 2015/0137789 A1 | 5/2015 | Furtner |
| 2015/0235634 A1 | 8/2015 | Liu et al. |
| 2016/0013958 A1* | 1/2016 | Mishra ............... H04L 25/0298 375/287 |
| 2016/0164705 A1 | 6/2016 | Whitby-Strevens |
| 2016/0173134 A1 | 6/2016 | Kwon et al. |
| 2016/0373557 A1 | 12/2016 | Sikkink et al. |
| 2017/0075854 A1 | 3/2017 | Hollis |
| 2017/0207908 A1 | 7/2017 | Cirit et al. |
| 2017/0220518 A1 | 8/2017 | Sengoku et al. |
| 2017/0310529 A1 | 10/2017 | Yang et al. |
| 2017/0373887 A1 | 12/2017 | Ho |
| 2018/0091189 A1 | 3/2018 | Chada et al. |
| 2018/0091335 A1 | 3/2018 | Schnizler |
| 2018/0123839 A1 | 5/2018 | Chung et al. |
| 2019/0199560 A1 | 6/2019 | Bossard et al. |
| 2019/0303340 A1 | 10/2019 | Lee et al. |
| 2019/0305765 A1 | 10/2019 | Lee et al. |
| 2019/0305995 A1 | 10/2019 | Lee et al. |

FOREIGN PATENT DOCUMENTS

| | | | |
|---|---|---|---|
| DE | 102019123711 A1 * | 3/2020 | ............ H03M 5/02 |
| EP | 3167579 B1 | 6/2018 | |
| KR | 20010065770 A | 7/2001 | |
| KR | 100321164 B1 | 3/2002 | |

OTHER PUBLICATIONS

Arnold, J.S., et al., Design of tightly-coupled multiprocessing programming, IBM Systems Journal, vol. 13 , Issue: 1, pp. 60-87, 1974.

Baek, Kwang-Hyun, et al., A Low Energy Encoding Technique for Reduction of Coupling Effects in SoC Interconnects, Proc. 43rd IEEE Midwest Symp. on Circuits and Systems, pp. 80-83, Lansing MI. Aug. 11, 2000.

Benini, Luca, et al., Address Bus Encoding Techniques for System-Level Power Optimization, Proceedings Design, Automation and Test in Europe, IEEE, Paris, France, Feb. 1998.

Benini, Luca, et al., Asymptotic Zero-Transition Activity Encoding for Address Busses in Low-Power Microprocessor-Based Systems, Proceedings Great Lakes Symposium on VLSI, IEEE, Urbana-Champaign, IL, USA, pp. 77-82, Mar. 1997.

Benini, Luca, et al., Power Optimization of Core-Based Systems by Address Bus Encoding, IEEE Transactions on Very Large Scale Integration (VLSI) Systems, vol. 6, No. 4, Dec. 1998, pp. 554-562.

Benini, Luca, et al., System-Level Power Optimization: Techniques and Tools, ISLPED99, San Diego, CA, USA,1999, pp. 288-293.

Bishop, Benjamin, et al., A Low-Energy Adaptive Bus Coding Scheme, Proceedings IEEE Computer Society Workshop on VLSI 2001. Emerging Technologies for VLSI Systems, Orlando, FL, USA, Apr. 2001, pp. 118-122.

Campbell, John E., et al., Design Considerations for a VLSI Microprocessor, IBM J. Res. Develop. vol. 26 No. 4,. Jul. 1982, pp. 454-463.

Canegallo, Roberto, et al., Low Power Techniques for FLASH Memories, ISCAS 2001. The 2001 IEEE International Symposium on Circuits and Systems (Cat. No. 01CH37196), May 2001, Sydney, NSW, Australia, IV-494-IV497.

Catthoor, F., et al., Global Communication and Memory Optimizing Transformations for Low Power Signal Processing Systems, Proceedings of 1994 IEEE Workshop on VLSI Signal Processing, La Jolla, CA, USA, Oct. 1994, pp. 178-187.

Chandrakasan, Anantha P., et al., A Low-Power Chipset for a Portable Multimedia I/O Terminal, IEEE Journal of Solid-State Circuits. vol. 29, No. 12, Dec. 1994, pp. 1415-1428.

Chandrakasan, Anantha P., et al., Low-Power CMOS Digital Design, IEEE Journal of Solid-State Circuits. vol. 27, No. 4. Apr. 1992, pp. 473-484.

Chandrakasan, Anantha P., et al., Minimizing Power Consumption in Digital CMOS Circuits, Proceedings of the IEEE, vol. 83, No. 4, Apr. 1995, pp. 498-523.

Chandrakasan, Anantha P., et al., Optimizing Power Using Transformations, IEEE Transactions on Computer-Aided Design of Integrated Circuits and Systems, vol. 14, No. 1, Jan. 1995, pp. 12-31.

Chang, Naehyuck, et al., Bus Encoding for Low-Power High-Performance Memory Systems, DAC '00: Proceedings of the 37th Annual Design Automation Conference, Jun. 2000, pp. 800-805.

(56) References Cited

OTHER PUBLICATIONS

Chang, Naehyuck, et al., Dual-Mode Low-Power Bus Encoding for High-Performance Bus Drivers,Conference: TENCON 99. Proceedings of the IEEE Region 10 Conference, vol. 2, Jan. 2000, pp. 876-879.
Chang, You-Sung, et al., Conforming Inverted Data Store for Low Power Memory, Proceedings. 1999 International Symposium on Low Power Electronics and Design (Cat. No. 99TH8477), Aug. 1999, San Diego, CA, USA.
Chao, H.H., et al., Designing the Micro370, IEEE Design & Test, Jun. 1987, pp. 32-40.
Chatterjee, Pallab, ULSI CMOS—The Next Ten years, Microelectronic Engineering 19 (1992), pp. 3-8.
Cheng, Wei-Chung, et al., Memory Bus Encoding for Low Power: A Tutorial, Proceedings of the IEEE 2001. 2nd International Symposium on Quality Electronic Design, Mar. 2001, San Jose, CA, USA, pp. 199-204.
Cheng, Wei-Chung, et al., Power-Optimal Encoding for DRAM Address Bus, ISLPED '00: Proceedings of the 2000 international symposium on Low power electronics and design, Aug. 2000, pp. 250-252.
Chou, Tan-Li, et al., Estimation of Circuit Activity Considering Signal Correlations and Simultaneous Switching, IEEE/ACM International Conference on Computer-Aided Design, Nov. 1994, pp. 300-303.
De Angel, Edwin, et al., Survey of Low Power Techniques for VLSI Design, Innovative Systems in Silicon Conference Session 6: Analog and Low Power Electronics, 1996, pp. 159-169.
Donaldson, Darrel D., et al., SNOS 1K x 8 Static Nonvolatile RAM, IEEE Journal of Solid-State Circuits, vol. SC-17, No. 5, Oct. 1982, pp. 847-851.
Elliott, R.C., Managed Load Distribution, Intelec '81—Third International Telecommunications Energy Conference, pp. 50-55.
Elpida, 128M bits Self Terminated interface DDR SDRAM, Preliminary Datasheet Ver. 1.0, Jul. 2002.
Ewen, J. F., et al., CMOS circuits for GB/s serial data communication, IBM J. Res. Develop. vol. 39 No. 1/2 Jan./Mar. 1995, pp. 73-81.
Fagan, John L., et al., A 16-kbit Nonvolatile Charge Addressed Memory, IEEE Journal of Solid-State Circuits, vol. SC-11, No. 5, Oct. 1976, pp. 631-636.
Fornaciari, William, et al., Influence of Caching and Encoding on Power Dissipation of System-Level Buses for Embedded Systems, Design, Automation and Test in Europe Conference and Exhibition, 1999. Proceedings (Cat. No. PR00078), Mar. 1999, Munich, Germany.
GDDR4 Read and Write DBI, GDDR4 SGRAM Data Inversion.
Givargis, Tony D., et al., Interface and Cache Power Exploration for Core-Based Embedded System Design, 1999 IEEE/ACM International Conference on Computer-Aided Design. Digest of Technical Papers (Cat. No. 99CH37051), Nov. 1999, pp. 270-273.
Green, J.H., et al., Line-Protection Switching, The Bell System Technical Journal, vol. 53, No. 10, Dec. 1974, USA, pp. 2011-2034.
Hakenes, Rolf, et al., A Segmented Gray Code for Low-Power Microcontroller Address Buses, Proceedings 25th Euromicro Conference. Informatics: Theory and Practice for the New Millennium, Sep. 1999, Milan, Italy.
Harboe-Sørensen, R., et al., Radiation Pre-screening of 4 Mbit Dynamic Random Access Memories for Space Application, RADECS 91 First European Conference on Radiation and its Effects on Devices and Systems, Sep. 1991, La Grande-Motte, France, pp. 489-504.
Harris, Erik P., et al., Technology Directions for Portable Computers, Proceedings of the IEEE, vol. 83, No. 4, Apr. 1995, pp. 636-658.
Hirsch, Donald J., Computer Communications Interface Devices for Tactical C3, Milcom 1986—IEEE Military Communications Conference: Communications-Computers: Teamed for the 90's, Oct. 1986, p. 5.4.1-5.4.5.
Hong, Sungpack, et al., Bus-Invert Coding for Low-Power IO—A Decomposition Approach, hoc. 43rd IEEE Midwest Symp. on Circuits and Systems, Lansing MI, Aug. 8-11, 2000, pp. 750-753.
Hossain, Rozak, et al., Low Power via Reduced Switching Activity and its Application to PLAs, pp. 100-103.
Hoyme, Kenneth, et al., SAFEbuS, Proceedings IEEE/AIAA 11th Digital Avionics Systems Conference, Oct. 1992, Seattle, WA, USA, pp. 68-73.
Hsieh, Cheng-Ta, et al., Architectural Power Optimization by Bus Splitting, Proceedings Design, Automation and Test in Europe Conference and Exhibition 2000 (Cat. No. PR00537), Mar. 2000, Paris, France.
Iizuka, Tetsuya, Substrate-fed CMOS Memory Device, 1978 International Electron Devices Meeting, Dec. 1978, Washington, DC, USA, pp. 222-226.
Irwin, Mary Jane, et al., Energy Issues in Multimedia Systems, 1999 IEEE Workshop on Signal Processing Systems. SIPS 99. Design and Implementation (Cat. No. 99TH8461), Oct. 1999, Taipei, Taiwan, pp. 24-33.
Kim, Kyeounsoo, et al., An Efficient Frame Memory Intcl-face of MPEG-2 Video Encoder ASIC Chip, IEEE Transaclions on Consumer Electronics, vol. 45, No. 3, Aug. 1999, pp. 507-514.
Kim, Sunghwan, et al., Low-power data representation, Electronics Letters May 25, 2000 vol. 36, No. 11, pp. 958-959.
Leung, Patrick S.-K., et al., Block-Inversion-Coded QAM Systems, IEEE Transactions on Communications, vol. 36, No. 7, Jul. 1988, pp. 797-805.
Lidgate, D., Electrical interlock design for complex high-power switching networks, Proc. IEE, vol. 126, No. 2, Feb. 1979, pp. 152-158.
Lin, Rung-Bin, et ai., Theoretical Analysis of Bus-invert Coding, Proc. 43rd IEFE Midwest Symp. on Circuits and Systems, Lansing MI, Aug. 8-11, 2000, pp. 742-745.
MacChiarulo, Luca, Low-Energy Encoding for Deep-Submicron Address Buses, ISLPED'01, Aug. 6-7, 2001, Huntington Beach, California, USA, pp. 176-181.
Mehta, Huzefa, et al., Some Issues in Gray Code Addressing, Proceedings of the Sixth Great Lakes Symposium on VLSI, Mar. 1996, Ames, IA, USA, pp. 178-181.
Moshnyaga, Vasily G., et al., Energy Saving Techniques for Architecture Design of Portable Embedded Devices, Proceedings. Tenth Annual IEEE International ASIC Conference and Exhibit (Cat. No. 97TH8334), Sep. 1997, Portland, OR, USA, pp. 163-167.
Mudge, Trevor, Power: A First-Class Architectural Design Constraint, Computer, Apr. 2001, pp. 52-58.
Murgai, Rajeev, et al., Using Complement at ion and Resequencing to Minimize Transitions, Proceedings 1998 Design and Automation Conference. 35th DAC. (Cat. No. 98CH36175), Jun. 1998, San Francisco, CA, USA, pp. 694-697.
Musoll, Enric, et al., Exploiting the locality of memory references to reduce the address bus energy, Proceedings of 1997 International Symposium on Low Power Electronics and Design, Aug. 1997, Monteray, CA, USA, pp. 202-207.
Nakamura, Kazuyuki, et al., A 50 % Noise Reduction Interface Using Low-Weight Coding, 1996 Symposium on VLSI Circuits Digest of Technical Papers, Jun. 1996, Honolulu, HI, USA, pp. 144-145.
Noll, Tobias G., Low-Power Strategies for High-Performance CMOS Circuits, ESSCIRC '94: Twientieth European Solid-State Circuits Conference, Sep. 1994, Ulm, Germany, pp. 72-83.
Orton, James L. et al., An Improved Channel Coding Algorithm for Low-Frequency Spectral Suppression, IEEE Transactions on Communications, vol. 37, No. 10, Oct. 1989, pp. 1088-1091.
Panda, Preeti R., Reducing Address Bus Transit ions for Low Power Memory Mapping, Proceedings ED&TC European Design and Test Conference, Mar. 1996, Paris, France, pp. 63-67.
Panda, Preeti Ranjan, et al., Low-Power Memory Mapping Through Reducing Address Bus Activity, IEEE Transactions on Very Large Scale Integration (VLSI) Systems, vol. 7, No. 3, Sep. 1999, pp. 309-320.
Park, Arvin, et al., Codes to Reduce Switching Transients Across VLSI I/O Pins, ACM SIGARCH Computer Architecture News, Sep. 1992, pp. 17-21.

(56) References Cited

OTHER PUBLICATIONS

Patra, P., et al., Power-efficient Delay-insensitive Codes for Data Transmission, Proceedings of the 28th Annual Hawaii International Conference on System Sciences—1995, pp. 316-323.

Pedram, Massoud, Power Optimization and Management in Embedded Systems, Proceedings of the ASP-DAC 2001. Asia and South Pacific Design Automation Conference 2001 (Cat. No. 01EX455), Feb. 2001, Yokohama, Japan, pp. 239-244.

Raghunathan, Anand, et al., Controller re-specification to minimize switching activity in controller/data path circuits, ISLPED 1996 Monterey CA USA, 1996, pp. 301-304.

Ramprasad, Sumant, et al., Achievable Bounds on Signal Transition Activity, 1997 Proceedings of IEEE International Conference on Computer Aided Design (ICCAD), Nov. 1997, San Jose, CA, USA, pp. 126-129.

Ramprasad, Sumant, et al., Coding for Low-Power Address and Data Busses: A Source-Coding Framework and Applications, Proceedings Eleventh International Conference on VLSI Design, Jan. 1998, Chennai, India, pp. 18-23.

Roy, Kaushik, et al., Design of Low Power Digital Systems, Emerging Technologies: Designing Low Power Digital Systems, May 1996, pp. 137-204.

Sacha, John R., et al., Number Representations for Reducing Data Bus Power Dissipation, Conference Record of Thirty-Second Asilomar Conference on Signals, Systems and Computers (Cat. No. 98CH36284), Nov. 1998, Pacific Grove, CA, USA, pp. 213-217.

Sasaki, Katsuro, et al., A 23-ns 4-Mb CMOS SRAM with 0.2-uA Standby Current, IEEE Journal.o f Solid-~Tatec Ircuits, vol. 25, No. 5, Oct. 1990, pp. 1075-1081.

Sechler, R.F., et al., Design at the system level with VLSI CMOS, IBM J. Res. Develop. vol. 39 .No. 1/2 Jan./Mar. 1995, pp. 5-22.

Shin, Youngsoo, et al., Narrow Bus Encoding for Low Power Systems, Proceedings 2000. Design Automation Conference. (IEEE Cat. No. 00CH37106), Jan. 2000, Yokohama, Japan, pp. 217-220.

Shin, Youngsoo, et al., Partial Bus-Invert Coding for Power Optimization of Application-Specific Systems, IEEE Transactions on Very Large Scale Integration (VLSI) Systems, vol. 9, No. 2, Apr. 2001, pp. 377-383.

Shin, Youngsoo, et al., Partial Bus-Invert Coding for Power Optimization of System Level Bus, Proceedings. 1998 International Symposium on Low Power Electronics and Design (IEEE Cat. No. 98TH8379), Aug. 1998, Monterey CA, USA, pp. 127-129.

Shin, Youngsoo, et al., Reduction of bus transitions with partial bus-invert coding, Electronics Letters Apr. 2, 1998 vol. 34, No. 7, pp. 642-643.

Siegmund, Robert, et al., Adaptive Partial Businvert Encoding for Power Efficient Data Transfer over Wde System Buses, Proceedings 13th Symposium on Integrated Circuits and Systems Design (Cat. No. PR00843), Sep. 2000, Manaus, Brazil, pp. 371-376.

Sotiriadis, Paul P., et al., Bus Energy Minimization by Transition Pattern Coding (TPC) in Deep Sub-Micron Technologies, IEEE/ACM International Conference on Computer Aided Design. ICCAD—2000. IEEE/ACM Digest of Technical Papers (Cat. No. 00CH37140), Nov. 2000, San Jose, CA, USA, pp. 322-327.

Sotiriadis, Paul P., et al., Transition Pattern Coding: An approach to reduce Energy in Interconnect, Proceedings of the 26th European Solid-State Circuits Conference, Sep. 2000, Stockholm, Sweden.

Stan, Mircea R., et al., Bus-Invert Coding for Low-Power I/O, IEEE Transactions on Very Large Scale Integration (VLSI) Systems, vol. 3, No. I , Mar. 1995, pp. 49-58.

Stan, Mircea R., et al., Two-Dimensional Codes for Low Power, ISLPED 1996 Monterey CA USA, pp. 335-340.

Stan, Mircea R., Low-Power Encodings for Global Communication in CMOS VLSI, IEEE Transactions on Large Scale Integration (VLSI) Systems, vol. 5, No. 4, Dec. 1997, pp. 444-455.

Su, Ching-Long, et al., Cache Designs for Energy Efficiency, Proceedings of the 28th Annual Hawaii International Conference on System Sciences—1995, pp. 306-315.

Su, Ching-Long, et al., Saving Power in the Control Path of Embedded Processors, IEEE Design & Test of Computers-Embedded Processors, Winter 1994, pp. 24-30.

Sundararajan, Vijay, et al., Data Transmission Over a bus with Peak-Limited Transition Activity, Proceedings 2000. Design Automation Conference. (IEEE Cat. No. 00CH37106), Jan. 2000, Yokohama, Japan, pp. 221-224.

Tabor, Jeff F., Noise Reduction Using Low Weight and Constant Weight Coding Techniques, MIT Artificial Intelligence Laboratory Technical Report 1232, May 11, 1990.

Torku, Kofi E., et al., Noise Problems in Testing VLSI Hardware, IEEE Design & Test of Computers, Dec. 1985, pp. 36-43.

Yang, Jun, et al., FV Encoding for Low-Power Data I/O, ISLPED'01, Aug. 6-7, 2001, Huntington Beach, California, USA, pp. 84-87.

U.S. Appl. No. 16/557,637, filed Aug. 30, 2019, Sunil Sudhakaran.

AN 835 PAM4 Signaling Fundamentals by Intel 03122019.

Hossain et al., Channel-Adaptive ADC and TDC for 28 Gb/s PAM-4 Digital Receiver.

Im et al., A 40-to-56 Gb/s PAM-4 Receiver With Ten-Tap Direct Decision-Feedback Equalization in 16-nm FinFET.

Khandelwal et al. DesignCon 2016 Year 2016.

Low Power Bus Transform Coding for Multi Level Signals 2006 ZAMAN.

P. S. Teja, "Design of Radix-8 Booth Multiplier Using Koggestone Adder for High Speed Arithmetic Applications," Emerging Trends in Electrical, Electronics & Instrumentation Engineering: An international Journal (EEIEJ), vol. 1, No. 1, Feb. 2014 (Year: 2014).

Pupalaikis et al., Designcon 2017, Inphi, 2017, (Year: 2017).

S. Samavi, "High Radix Multipliers," Jan. 2014, retrieved from https://www.researchgate.net/publication/262836009 (Year: 2014).

Space Coding Applied to High Speed Chip FARZAN 2004.

Zhang et al., PAM4 Signalling for 56G Serial Link Applications—A Tutorial (Year: 2016).

Yang, Jun, et al., FV Encoding for Low-Power Data I/O, ISLPED'01: Proceedings of the 2001 International Symposium on Low Power Electronics and Design (IEEE Cat. No. 01TH8581), Aug. 2001, Huntington Beach, CA, USA, pp. 84-87.

* cited by examiner

DATA BUS INVERSION (DBI) ON PULSE AMPLITUDE MODULATION (PAM) AND REDUCING COUPLING AND POWER NOISE ON PAM-4 I/O

CROSS REFERENCE TO RELATED APPLICATIONS

This application claims the benefit of U.S. provisional patent application Ser. No. 62/650,168, filed on Mar. 29, 2018, the contents of which are incorporated herein by reference in their entirety.

BACKGROUND

Modern high throughput systems utilize multiple high bandwidth input/output interfaces to form a signaling network between compute units, memory devices, and storage devices. For example, Peripheral Component Interconnect Express (PCI-E) connects multiple periphery devices to central processing units (CPUs) and graphics processing units (GPUs). These interfaces may comprise multiple serial data buses that operate at high frequency.

Pulse amplitude modulation (PAM) may be utilized on a multi-lane serial data bus to transfer multiple bits of data simultaneously by encoding the data as different voltage levels. Here, "lane" refers to a single wire of a serial data bus. A "symbol burst" refers to bits placed on the data lanes of a serial data bus in a same bus clock interval, i.e., in parallel.

An example of PAM communication is PAM-4. During each bus clock interval, PAM-4 encodes two bits of data (00, 01, 10, 11) on each data lane of a serial data bus as one of four different voltage levels (symbols). Because two bits are encoded into each bus clock interval on each data lane, PAM-4 ideally enables twice the bandwidth compared to conventional two-level (e.g., PAM-2) signaling on serial data buses operating at comparable bus clock frequencies. PAM-4 symbols utilize four different voltage levels and therefore there is less voltage-level distinction between symbol values in PAM-4 compared to PAM-2. This makes PAM-4 communications more vulnerable to interference effects such as coupling noise between data lanes on a serial data bus, and power supply noise, which reduces the signal to noise ratio (SNR).

One mechanism to mitigate these noise effects is to utilize Data Bus Inversion (DBI). For a given symbol burst, DBI reduces the total extent of voltage level transitions across the data lanes of a serial data bus by up to half by intelligently setting the polarity of the bits in each symbol burst on the serial data bus. DBI requires an additional metadata bit per symbol burst to transfer the symbol burst polarity setting (non-inverted symbol burst, or inverted symbol burst) to the receiver. This metadata bit is often transmitted on an extra wire that is separate from the data lanes (each also one wire, typically) of the serial data bus.

BRIEF SUMMARY

In one aspect, a PAM communication process involves configuring a threshold sum condition, generating a sum of transition values between voltage levels of original symbols to be sent concurrently in a same transmission interval over a plurality of data lanes, comparing the sum to the threshold sum condition, and in response to the sum being less than (or alternatively, greater than) the threshold sum condition, substituting new symbols for the original symbols based on a preset substitution scheme.

In another aspect, a PAM communication process involves receiving a plurality of symbol values to be transmitted concurrently within a same time interval across multiple data lines, encoding the symbols into new symbols from a middle region of a transition-energy (TE) balanced mapping matrix, and communicating the new symbols in the same time interval across the multiple data lines.

In yet another aspect, a PAM communication method involves receiving a plurality of original symbols to be transmitted concurrently within a same time interval across multiple data lines, determining a number of the original symbols that correspond to the generation of extreme voltage levels on the data line, and as a result of the number of the original symbols exceeding a preset number, setting a DBI bit and substituting new symbols for the original symbols, wherein the new symbols do not correspond to the generation of the extreme voltage levels. The new symbols are transmitted concurrently within the same time interval across the multiple data lines.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
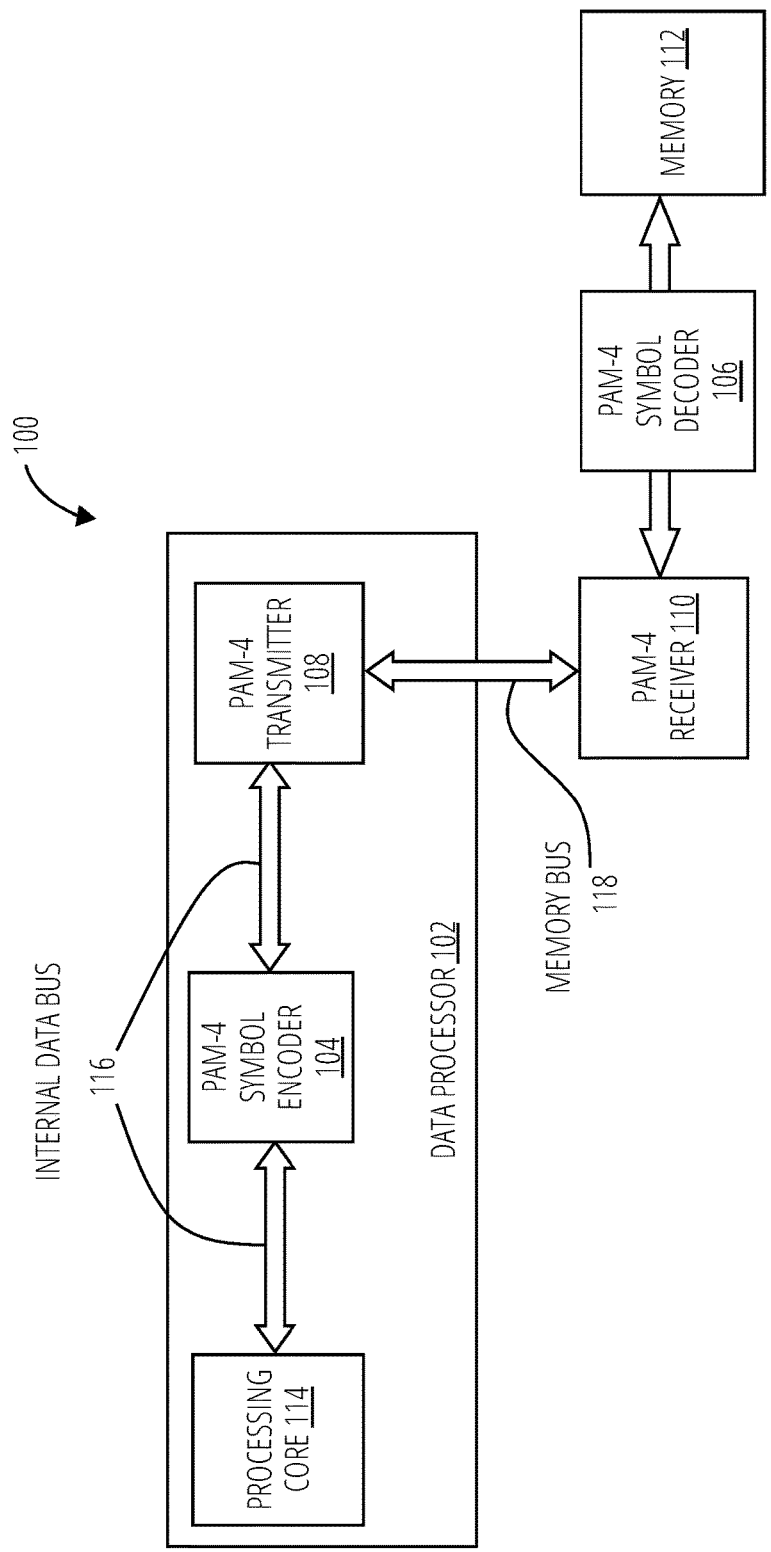
FIG. 1 illustrates a data communication system 100 in accordance with one embodiment.

Referring to FIG. 1, a data communication system 100 comprises a transmitting device such as a data processor 102 that includes a processing core 114, PAM-4 symbol encoder 104, and a PAM-4 transmitter 108. The data processor 102 may in some embodiments comprise a graphics processing unit (GPU), a central processing unit (CPU), a system on a chip (SoC), or other well-known data processing devices.

The data processor 102 communicates with a receiving device such as a memory 112 over a bus such as a memory bus 118. A PAM-4 receiver 110 and PAM-4 symbol decoder 106 receive and process PAM-4 signals communicated from the data processor 102 to the memory 112 over the memory bus 118.

The data processor 102 utilizes an internal data bus 116 to transmit data bursts to and from the processing core 114 over a multi-lane internal data bus 116. The PAM-4 symbol encoder 104 receives a burst of data to encode from the processing core 114 and performs PAM-4 encoding on that burst. The PAM-4 transmitter 108 transmits the encoded burst to the PAM-4 receiver 110 via the memory bus 118. The PAM-4 receiver 110 receives the encoded burst and sends the encoded burst to the PAM-4 symbol decoder 106 to decode the burst. Once decoded, the burst is sent to the memory 112.

This is a simplified diagram. In practice, there would typically be encoders and decoders on both ends of the memory bus 118 for both writing to and reading from the memory 112.

Figure 2:
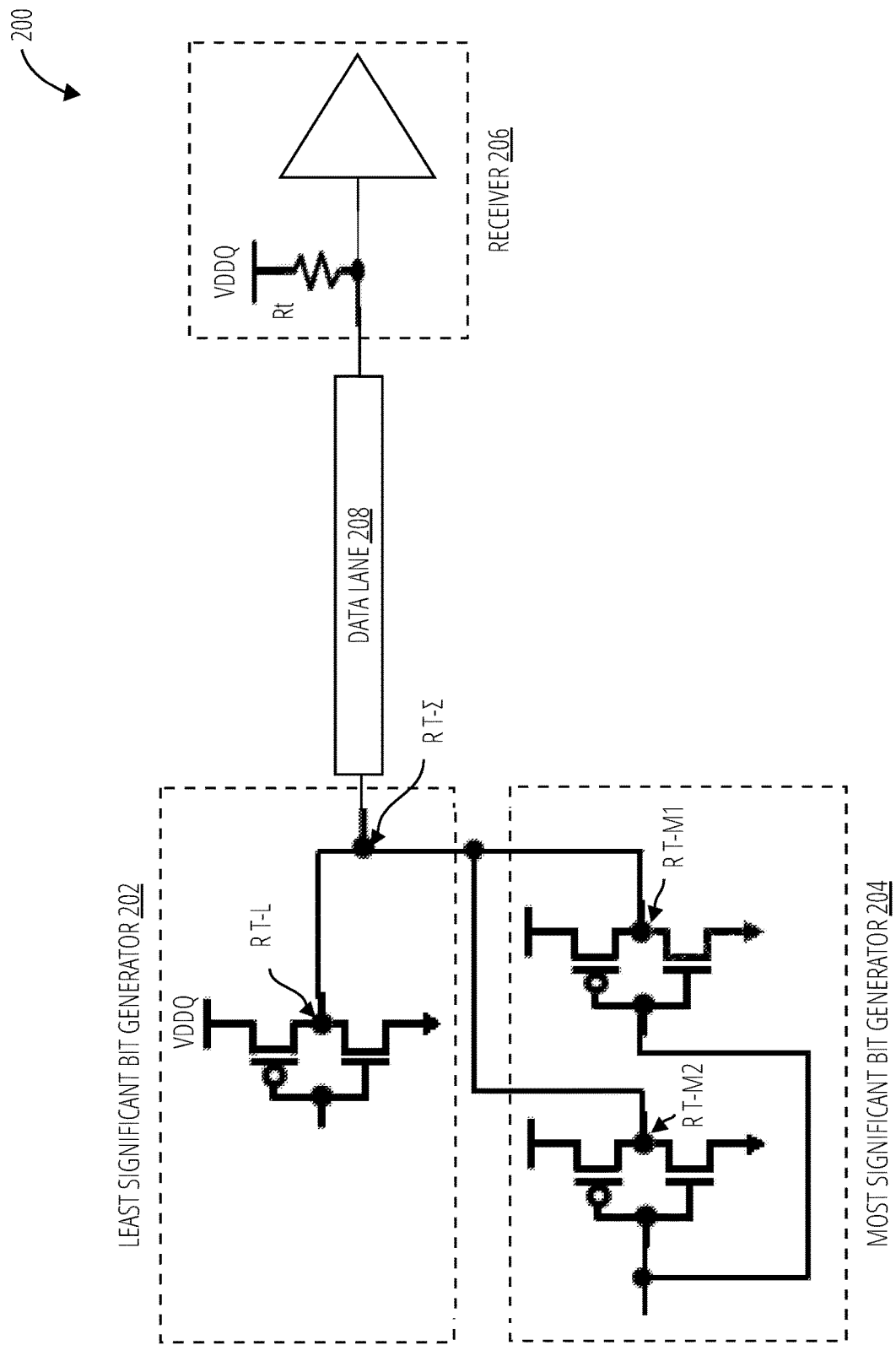
FIG. 2 illustrates an embodiment of a PAM-4 transceiver 200.

FIG. 2 illustrates a PAM-4 transceiver 200 for a single data lane of a serial data bus in one embodiment. The PAM-4 transceiver 200 comprises a least significant bit transmitter 202, a most significant bit transmitter 204, a receiver 206, and a data lane 208. The PAM-4 transceiver 200 utilizes the least significant bit transmitter 202 and the most significant bit transmitter 204 to generate a four-level symbol on the data lane 208. Herein the term "symbol" refers to a voltage level generated by a line driver on a serial data bus data lane, where the voltage level represents the value of one or more bits of data. Thus "encoding a symbol" means physically configuring a line driver circuit of the serial data bus to drive the voltage on the data lane to a particular value.

For example, if the two-bits of data to encode into the symbol are (1,1), the outputs of the least significant bit transmitter 202 and most significant bit transmitter 204 combine to generate a voltage of, e.g., 1.2 V on the data lane 208 and current on the data lane 208 is, e.g., 0 mA due to the pull-up transistor Rt at the receiver 206 (both ends of the data lane 208 are at the same potential). If the two-bits of data to encode into the symbol are (1,0), the outputs of the least significant bit transmitter 202 and most significant bit transmitter 204 combine to generate a voltage of, e.g., 1.0 V on the data lane 208 and current on the data lane 208 is, e.g., 7 mA. If the two-bits of data to encode into the symbol are (0,1), the outputs of the least significant bit transmitter 202 and most significant bit transmitter 204 combine to generate a voltage of, e.g., 0.8 V on the data lane 208 and current on the data lane 208 is, e.g., 11 mA. If the two-bits of data to encode into the symbol are (0,0), the outputs of the least significant bit transmitter 202 and most significant bit transmitter 204 combine to generate a voltage of, e.g., 0.6 V on the data lane 208 and current on the data lane 208 is, e.g., 12.5 mA. The 0.6V may be referred to herein as the base transmission voltage Vb from which the other symbol voltage levels are delta-ed.

The symbol value on a data lane therefore corresponds to the current consumption of that data lane during a data burst. Weights may therefore be assigned to the symbol values reflecting their current consumption cost. For example, a weight of 0 may be assigned to the symbol for the bit pair (1,1); a weight of 1 may be assigned for the symbol for the bit pair (1,0); a weight of 2 may be assigned to the symbol for the bit pair (0,1); and a weight of 3 may be assigned for the symbol for the bit pair (0,0).

In this example, a data burst on an eight lane serial data bus utilizing PAM-4 encoding may be assigned a total weight that ranges from 0 to 24, which equates to a current consumption range of, e.g., 0 to 100 mA. The total weight for the data burst would be 0 if all the symbols in the data burst each encoded the bit pair (1,1), and the total weight for the data burst would be 24 if all the symbols in the data burst each encoded the bit pair (0,0). Data bursts comprising all 0's consume the most current, hence are the most expensive from a power consumption standpoint.

Figure 3:
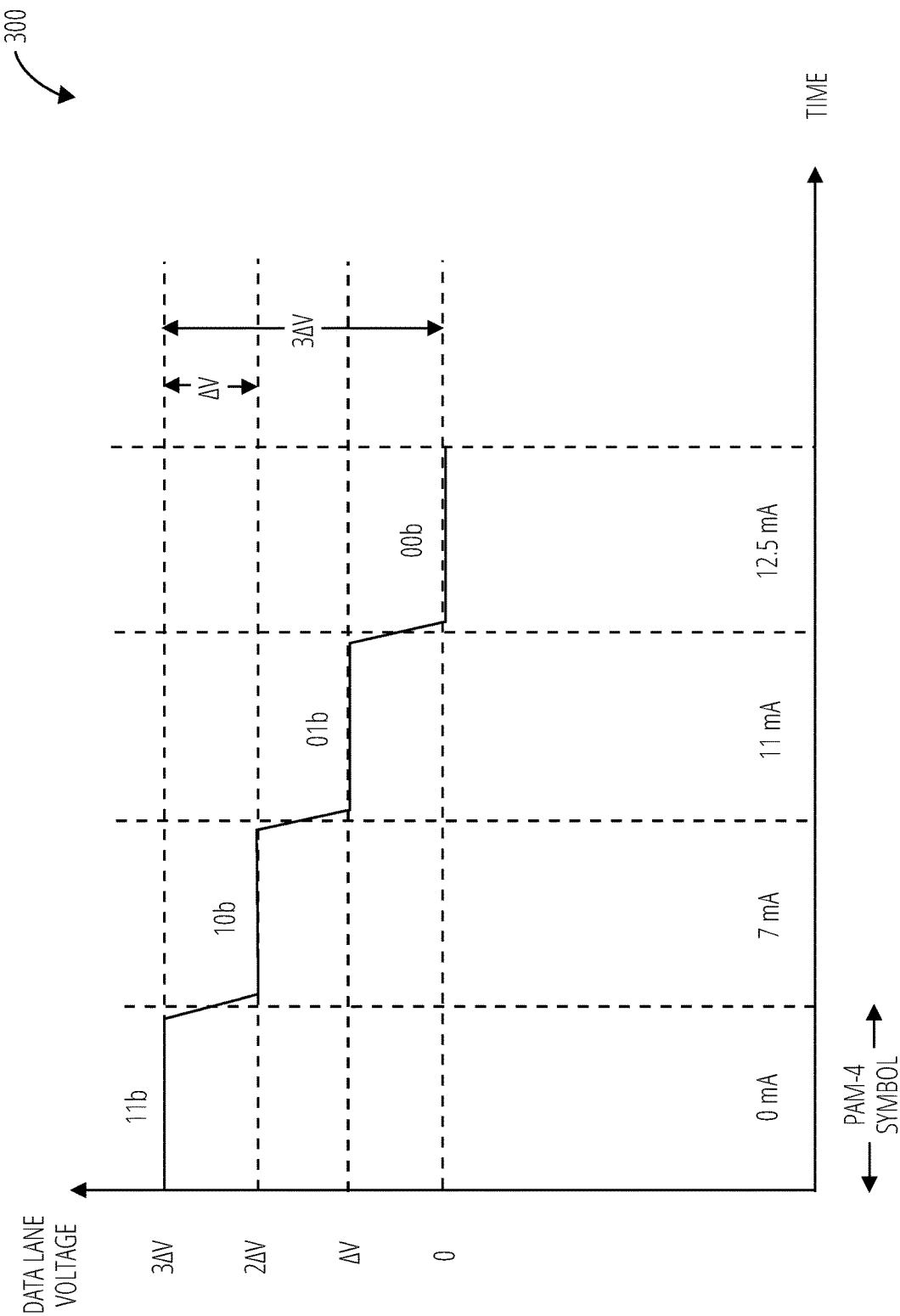
FIG. 3 illustrates an embodiment of a PAM-4 encoding 300.

Referring to FIG. 3, a PAM-4 encoding 300 encodes each two bits to communicate on a data lane of a serial data bus as a PAM-4 symbol. Each of the four possible symbols corresponds to a voltage level and a current level on the data lane. In FIG. 3 the four symbols corresponding to the bit pairs <00>, <01>, <10>, and <11> are labeled with their relative voltage level from the lowest voltage symbol, which is utilized as a baseline value. There are four possible voltage levels in a PAM-4 symbol, therefore there are four possible voltage deltas between two symbols. Both of the voltage level and voltage delta of a symbol (relative to another symbol or from the baseline value) may be represented as $0\Delta V$, $1\Delta V$, $2\Delta V$, and $3\Delta V$. In general $3\Delta V$ voltage deltas between symbols on a data lane generate more noise on the serial data bus than do lower voltage deltas.

Figure 4:
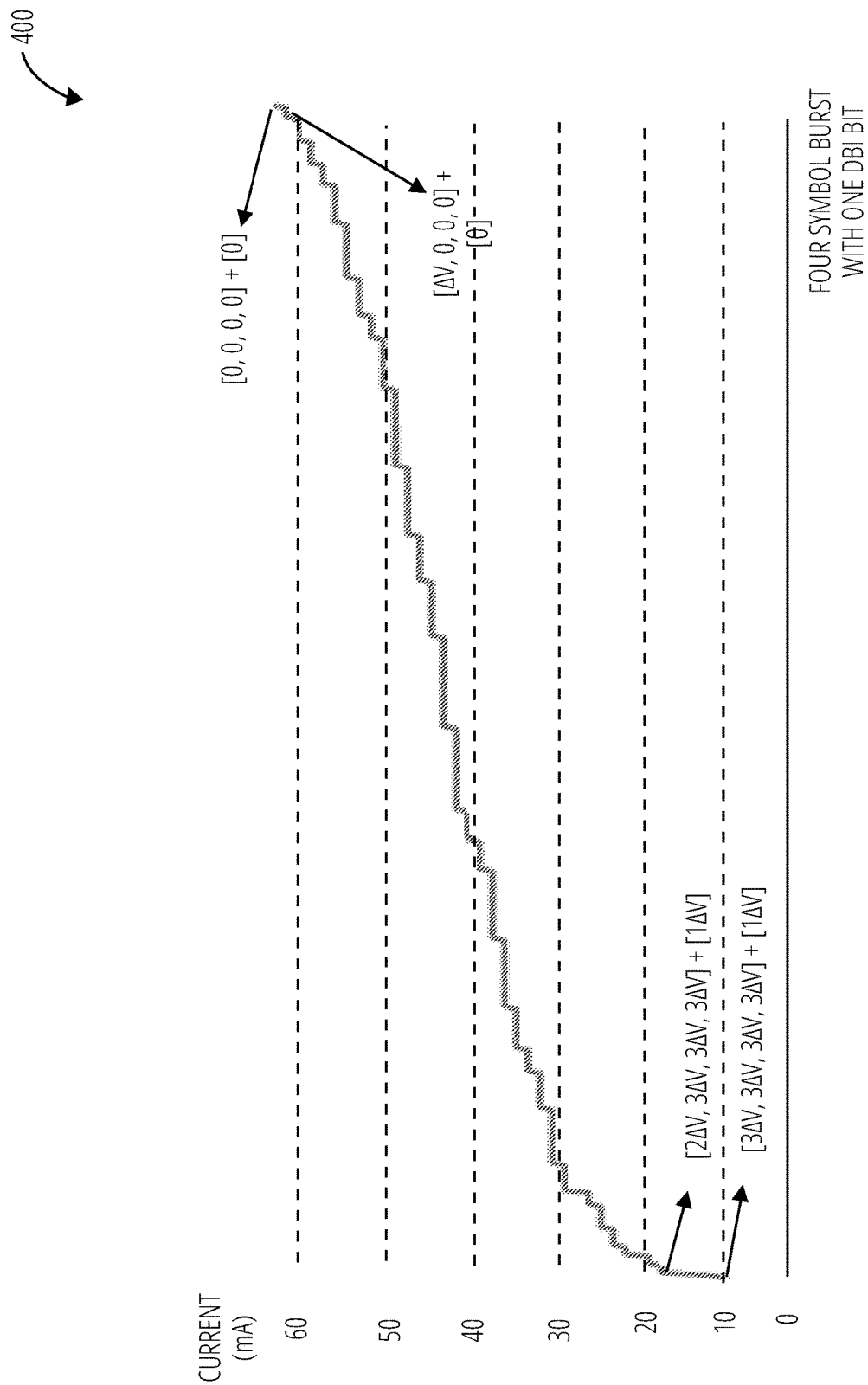
FIG. 4 illustrates an example of energy consumption profile 400 in a PAM-4 system.

Referring now to the energy consumption profile 400 of FIG. 4, there exists a non-linear relationship between the data lane current consumption and the PAM-4 symbol sequence utilized on the data lane in some PAM-4 communication systems. The illustrated energy consumption profile 400 is for possible combinations of symbols and 1 bit of DBI data sent in a burst (in the same clock interval) over a four data lane serial data bus utilizing a 1-bit DBI lane. The energy consumption profile 400 is sorted by increasing current consumption. The relative change in current consumption resulting from a $1\Delta V$ change between bursts is much higher on the left end of the energy consumption profile 400 than it is on the right end. For example a change from [$3\Delta V$, $3\Delta V$, $3\Delta V$, $3\Delta V$, $1\Delta V$] to [$2\Delta V$, $3\Delta V$, $3\Delta V$, $3\Delta V$, $1\Delta V$] (left end of the energy consumption profile 400) results in a 7 mA change in current consumption, while a change from [$0\Delta V$, $0\Delta V$, $0\Delta V$, $0\Delta V$, $0\Delta V$] to [$1\Delta V$, $0\Delta V$, $0\Delta V$, $0\Delta V$, $0\Delta V$] (right end of the energy consumption profile 400) results in only a 1.5 mA change in current consumption.

The four symbols communicated on the four data lanes in each burst correspond to eight bits of actual data (two bits per symbol) and thus may be represented together as one 8-bit code word. The codeword need not include the actual bits that are communicated—any 8-bit codeword may be used to represent the value of the eight data bits in a burst. Because there is also one bit of metadata available with each burst (the DBI bit), two codeword tables may be utilized and the codeword may be selected from one or the other in a manner that (a) mitigates current consumption changes (and hence noise) on the serial data bus, or (b) reducing overall energy consumption on the serial data bus. The DBI bit may be utilized to identify when symbol substitution is utilized for a particular burst.

For example, the metadata bit may be set to a certain value (e.g., "1") when the sum of $\Delta V$ changes between a current burst and the previous one is less than half of a maximum possible $\Delta V$ change that could occur between bursts. This embodiment selects codewords to represent the eight bits of data in the current burst from the left half of the energy consumption profile 400. Another embodiment may select codewords representing values from the right half of the energy consumption profile 400 when the sum of $\Delta V$ is larger than half of the maximum possible $\Delta V$ sum. These two techniques each have pros and cons. Selecting codewords from the left half of the energy consumption profile 400 leads to: i) reducing the overall energy consumption on the serial data bus, but, ii) allowing a larger maximum possible change in the current consumption between bursts.

Selecting codewords from the right half of the energy consumption profile 400 leads to: i) reducing the maximum possible change in the current consumption, but, ii) increasing the overall energy consumption. For the both cases, the maximum voltage delta change over the four data lanes between bursts is reduced by 50%.

To obtain benefits from both mechanisms, a codeword table may be formed from a middle portion of the values in the energy consumption profile 400. There are many options for forming a codeword table in this way. One example utilizes a codeword table indexed by an 8-bit address (e.g., the unencoded data bits to communicate on the four data lanes of the serial data bus) in which each entry of the codeword table comprises a 9-bit value (the eight data bits and one DBI bit) from a middle range of the energy consumption profile 400. A codeword table or "codebook" having this characteristic is referred to herein as a level-energy balanced mapping matrix. Techniques of this type may reduce the maximum voltage deltas between bursts on the serial data bus by 50% and the maximum power deltas by 70% with a similar average current compared to conventional PAM-4 communications. Another approach is to select codewords that reduce the use of extreme PAM domain voltage levels on the data lanes (e.g., 0ΔV and 3ΔV symbol voltage levels), as discussed further below.

Figure 5:
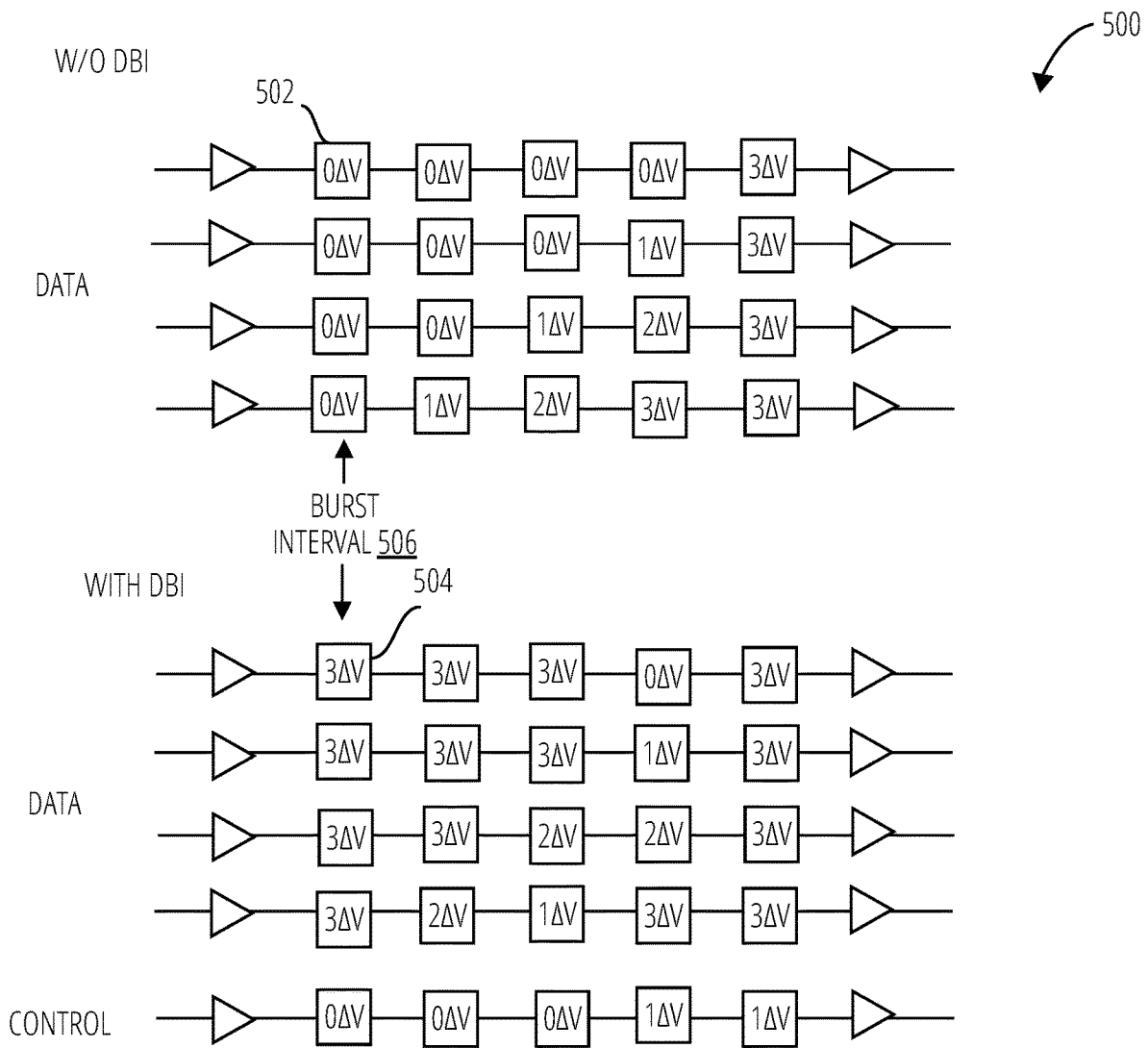
FIG. 5 illustrates an embodiment of encoding process 500.

Referring to FIG. 5, an embodiment of an encoding process 500 process determines whether to substitute an original symbol burst 502 with a codeworded symbol burst 504 for each burst interval 506. A sum of voltage deltas over the multiple data lanes (here, four data lanes) is made for each burst interval 506 to determine a sum of transition values. If the sum is less than half the maximum possible sum of voltage deltas that can occur in a time interval (here, 12ΔV/2=6ΔV), codeword substitution is performed on the original symbol burst 502 and the control bit to select substitution is set (e.g., set to 1ΔV from 0ΔV) for the burst interval 506. In another mode codeword substitution may occur if the sum is greater than half of the maximum possible sum.

The encoding process 500 thus reduces the maximum voltage switching by 50% with only one bit of metadata, matching the performance of conventional DBI on PAM-2. While the encoding process 500 provides a reasonable reduction in the maximum voltage switching, it only reduces the maximum power change by 25%, which is significantly less than that what is achieved with PAM-2. This is because of the non-linear characteristic on the relationship between voltage levels and current consumption on a typical PAM-4 data lane.

The encoding process 500 effectively selects encodings from the left half of the energy consumption profile 400 represented in FIG. 4. Alternatively, the encoding process 500 may select from the right half of the energy consumption profile 400 if the sum of ΔV for the burst is larger than half of the maximum possible ΔV.

Figure 6:
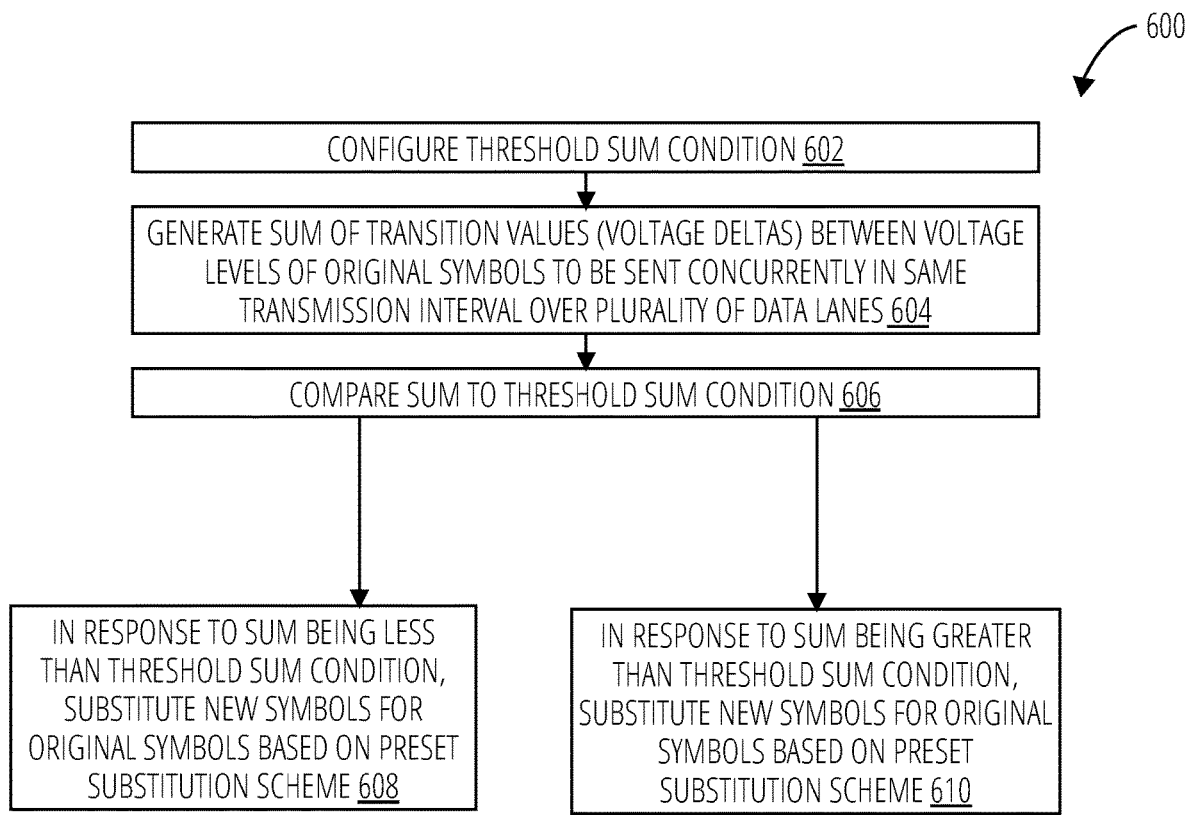
FIG. 6 illustrates a routine 600 in accordance with one embodiment.

Referring to FIG. 6, a generalized routine 600 for level-based DBI configures a threshold sum condition (block 602). Next at block 604 the routine 600 generates a sum of transition values (voltage deltas) between voltage levels of original symbols to be sent concurrently in a same transmission interval over a plurality of data lanes. Further, the routine 600 compares the sum to the threshold sum condition (block 606). In response to the sum being less than the threshold sum condition, the routine 600 substitutes new symbols for the original symbols based on a preset substitution scheme (block 608).

In some embodiments the new symbols are inverted values of the original symbols. The threshold sum condition may be half of a maximum possible value for the sum, or some other preset threshold fraction of the maximum. Further, the routine 600 may set one or more bit values on a DBI line indicating that the new symbols were substituted for the original symbols.

Alternatively, in response to the sum being greater than the threshold sum condition, the routine 600 substitutes new symbols for the original symbols based on a preset substitution scheme (block 610).

Figure 7:
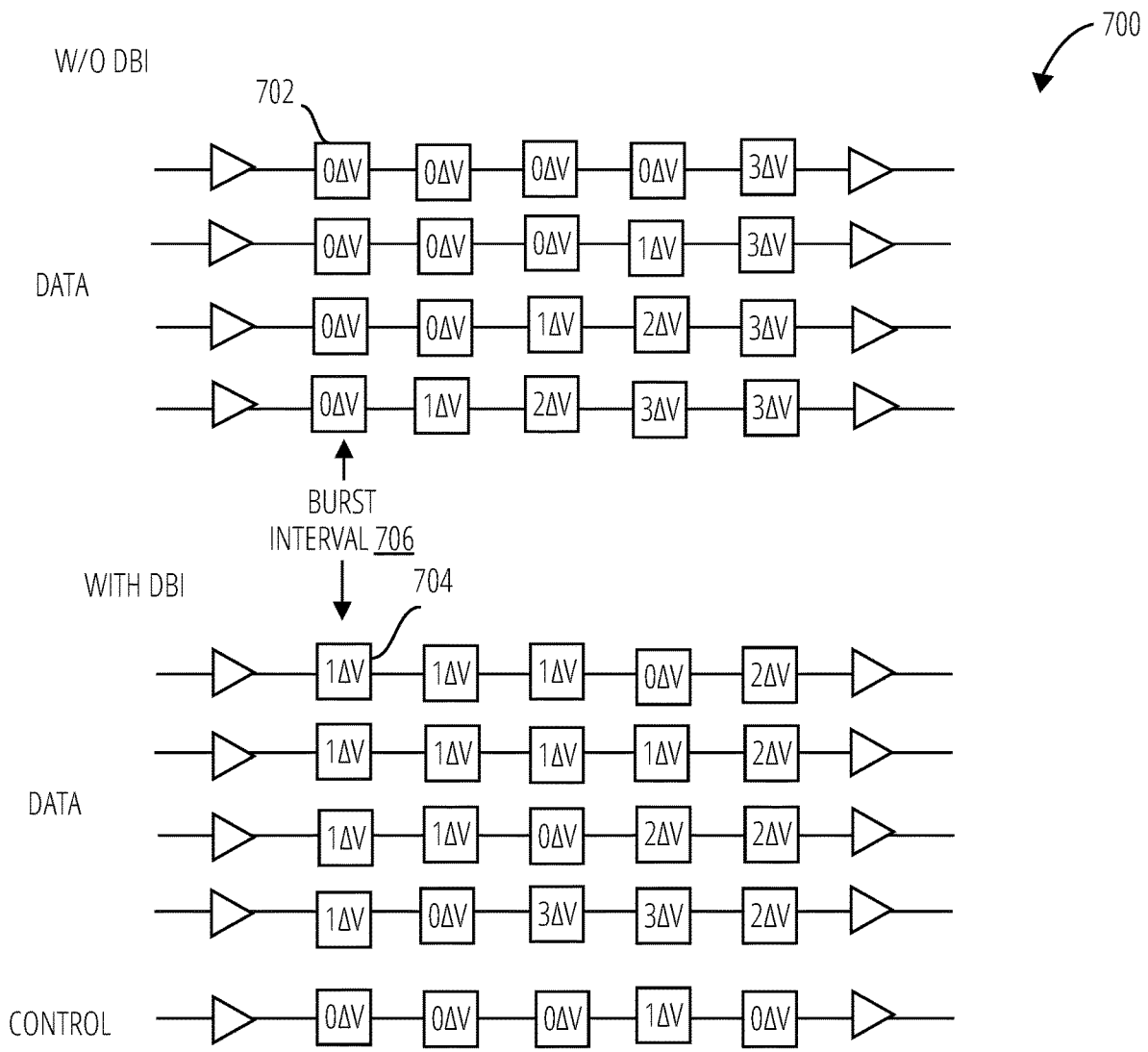
FIG. 7 illustrates an embodiment of energy-based encoding scheme 700.

Referring to FIG. 7, an embodiment of an energy-based encoding scheme 700 determines whether to switch an original symbol burst 702 to a codeworded symbol burst 704 for each burst interval 706. For each burst interval 706, there is a determination of whether there is are dominant values (i.e., symbols encoded at an extreme voltage level), where either 0ΔV or 3ΔV (or another extreme voltage level, for PAM schemes other than PAM-4) occurs more than once, or more than another preset number of times. If the substitution condition is met, each symbol is replaced by a codeword symbol representing the neighboring value of the original symbol (0ΔV<->1ΔV and 3ΔV<->2ΔV) and a value is set on the DBI line indicating that substitutions were made in the burst. Effectively, this substitution scheme inverts the least significant bit of the 2-bits of data of the original symbols by substituting extreme values and their adjacent values. This scheme works by counting the number of bit pairs in a burst that encode to extreme symbol voltage values (e.g., <00> or <11> for PAM-4). If for example the number of extreme values exceeds half the number of symbols in the group, the metadata inversion bit may be set and the 00 values become 01, the 01 values become 00, the 11 values become 10, and the 10 values become 11. A version of this scheme utilizing two meta-data bits per burst interval (e.g., where each DBI value in a burst interval is a four-level PAM-4 symbol) can conditionally swap 00 and 01 (the example for PAM-4) if the number of 00 signals exceed the number of 01 signals, and conditionally swap 11 and 10 if the number of 11 signals exceed the number of 10 signals.

Another embodiment of energy-based encoding scheme 700 makes the substitutions using codewords representing a middle portion of the values in the energy consumption profile 400.

Figure 8:
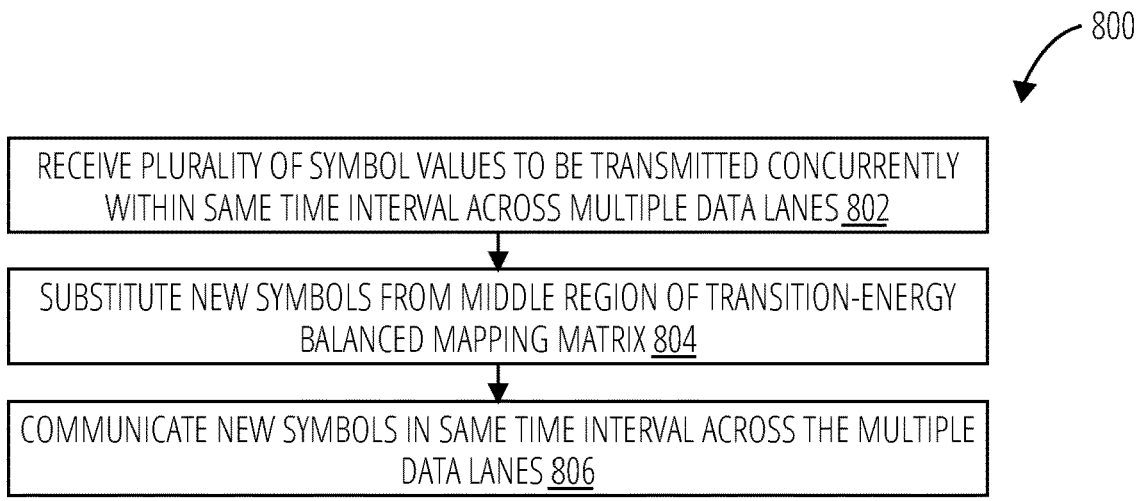
FIG. 8 illustrates a routine 800 in accordance with one embodiment.

Referring to FIG. 8, an energy-based DBI routine 800 receives a plurality of symbols to be transmitted concurrently within a same time interval across multiple data lanes (block 802). The routine 800 substitutes the symbols for new symbols from a middle region of a level-energy balanced mapping matrix (block 804). The routine 800 communicates the new symbols in the same time interval across the multiple data lanes (block 806).

Figure 9:
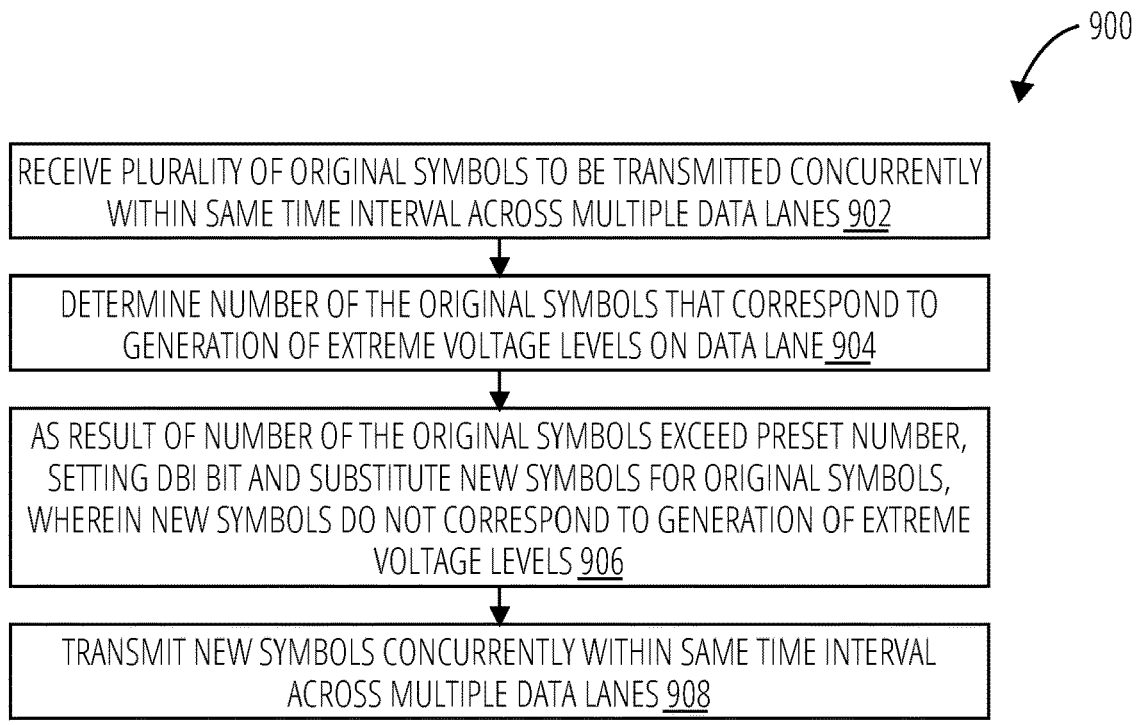
FIG. 9 illustrates a routine 900 in accordance with one embodiment.

Referring to FIG. 9, an energy-based DBI routine 900 receives a plurality of original symbols to be transmitted concurrently within a same time interval across multiple data lanes (block 902). The routine 900 determines a number of the original symbols that correspond to the generation of extreme voltage levels on the data lane (block 904). As a result of the number of the original symbols exceeding a preset number, a DBI bit is set and the new symbols are substituted for the original symbols, wherein the new symbols do not correspond to the generation of the extreme voltage levels (block 906). The routine 900 transmits the new symbols concurrently within the same time interval across the multiple data lanes (block 908). In some PAM-4 embodiments, the original symbols correspond to voltage levels of 0ΔV, 1ΔV, 2ΔV, or 3ΔV, and thus the routine 900 determines a number of the original symbols in a burst corresponding to either 0ΔV or 3ΔV.

The data for original symbols may comprise a most significant bit and a least significant bit and substituting the new symbols for the original symbols in the time interval may comprise switching the least significant bit of data for the original symbols. Alternatively, substituting the new symbols for the original symbols in the time interval may comprise switching the most significant bit of the data for the original symbols.

Figure 10:
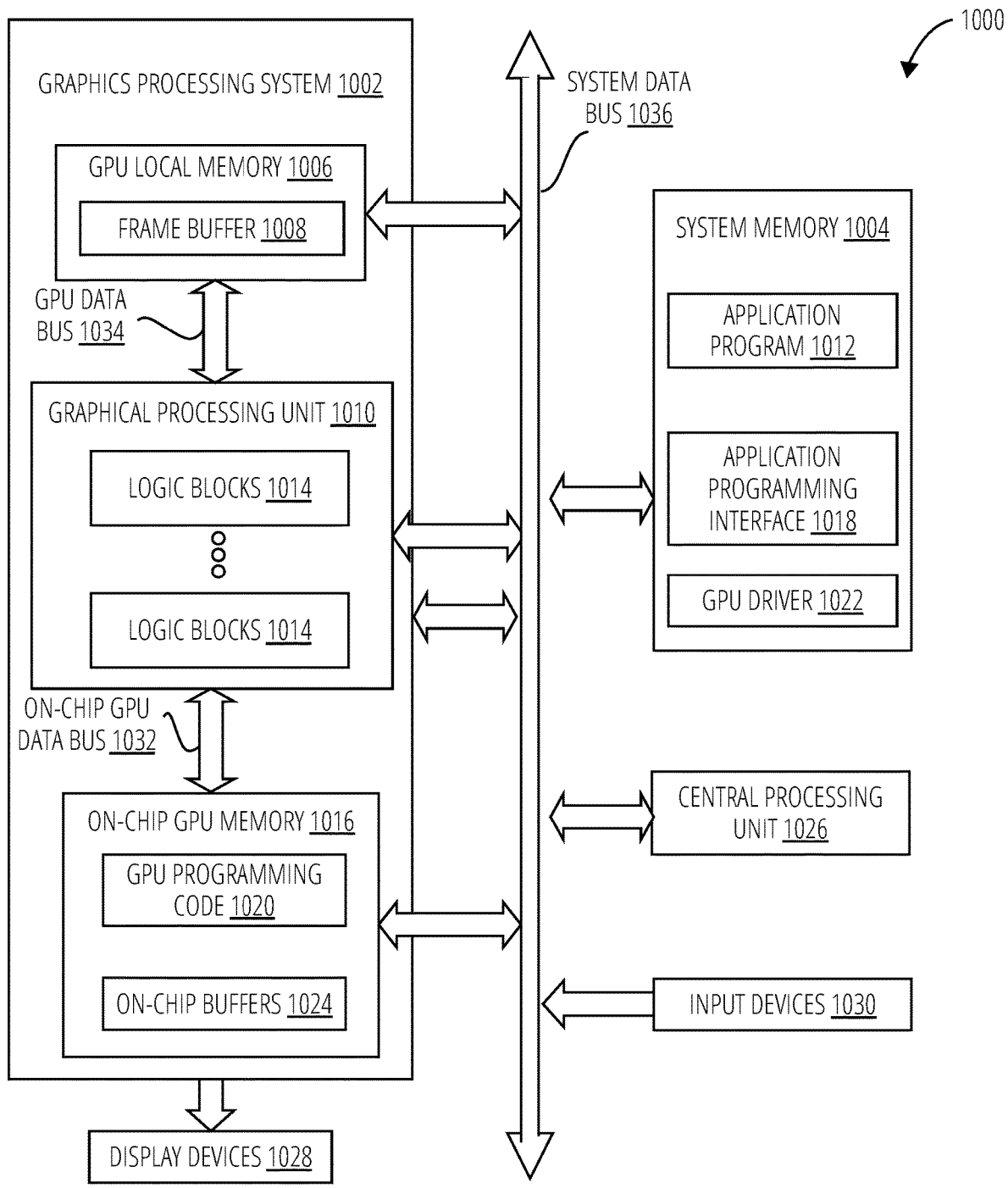
FIG. 10 is a block diagram of a computing system 1000 including a GPU in which aspects of the invention may be embodied or carried out.

FIG. 10 is a block diagram of one embodiment of a computing system 1000 in which one or more aspects of the invention may be implemented. The computing system 1000 includes a system data bus 1036, a CPU 1026, input devices 1030, a system memory 1004, a graphics processing system 1002, and display devices 1028. In alternate embodiments, the CPU 1026, portions of the graphics processing system 1002, the system data bus 1036, or any combination thereof, may be integrated into a single processing unit. Further, the functionality of the graphics processing system 1002 may be included in a chipset or in some other type of special purpose processing unit or co-processor.

As shown, the system data bus 1036 connects the CPU 1026, the input devices 1030, the system memory 1004, and the graphics processing system 1002. In alternate embodiments, the system memory 1004 may connect directly to the CPU 1026. The CPU 1026 receives user input from the input devices 1030, executes programming instructions stored in the system memory 1004, operates on data stored in the system memory 1004, and configures the graphics processing system 1002 to perform specific tasks in the graphics pipeline. The system memory 1004 typically includes dynamic random access memory (DRAM) employed to store programming instructions and data for processing by the CPU 1026 and the graphics processing system 1002. The graphics processing system 1002 receives instructions transmitted by the CPU 1026 and processes the instructions to perform various operations inside the computing system 1000.

As also shown, the system memory 1004 includes an application program 1012, an API 1018 (application programming interface), and a graphics processing unit driver 1022 (GPU driver). The application program 1012 generates calls to the API 1018 to produce a desired set of results. For example the application program 1012 also transmits programs to the API 1018 to perform shading operations, artificial intelligence operations, or graphics rendering operations. The API 1018 functionality may be typically implemented within the graphics processing unit driver 1022. The graphics processing unit driver 1022 is configured to translate the high-level shading programs into machine code.

The graphics processing system 1002 includes a GPU 1010 (graphics processing unit), an on-chip GPU memory 1016, an on-chip GPU data bus 1032, a GPU local memory 1006, and a GPU data bus 1034. The GPU 1010 is configured to communicate with the on-chip GPU memory 1016 via the on-chip GPU data bus 1032 and with the GPU local memory 1006 via the GPU data bus 1034. The GPU data bus 1034 may utilized one or more of the encoding techniques described herein.

The GPU 1010 may receive instructions transmitted by the CPU 1026 and store results in the GPU local memory 1006. Subsequently, if the instructions were graphics instructions, the GPU 1010 may display certain graphics images stored in the GPU local memory 1006 on the display devices 1028.

The GPU 1010 includes one or more logic blocks 1014. The operation of the logic blocks 1014 may implement embodiments of the encoding schemes described herein. The logic blocks 1014 may be loaded on the GPU as instructions or may be implemented in circuitry as instruction set architecture features, or a combination of both of these.

The GPU 1010 may be provided with any amount of on-chip GPU memory 1016 and GPU local memory 1006, including none, and may employ on-chip GPU memory 1016, GPU local memory 1006, and system memory 1004 in any combination for memory operations. The data/instruction busses between these memories and the GPU 1010 may utilize one or more of the encoding techniques described herein.

The on-chip GPU memory 1016 is configured to include GPU programming 1020 and on-Chip Buffers 1024. The GPU programming 1020 may be transmitted from the graphics processing unit driver 1022 to the on-chip GPU memory 1016 via the system data bus 1036. The system data bus 1036 may utilize one or more of the encoding techniques described herein.

By way of example, the GPU programming 1020 may include a machine code vertex shading program, a machine code geometry shading program, a machine code fragment shading program, an artificial intelligence program, or any number of variations of each. The on-Chip Buffers 1024 are typically employed to store data that requires fast access to reduce the latency of such operations.

The GPU local memory 1006 typically includes less expensive off-chip dynamic random access memory (DRAM) and is also employed to store data and programming employed by the GPU 1010. As shown, the GPU local memory 1006 includes a frame buffer 1008. The frame buffer 1008 stores data for at least one two-dimensional surface that may be employed to drive the display devices 1028. Furthermore, the frame buffer 1008 may include more than one two-dimensional surface so that the GPU 1010 can render to one two-dimensional surface while a second two-dimensional surface is employed to drive the display devices 1028.

The display devices 1028 are one or more output devices capable of emitting a visual image corresponding to an input data signal. For example, a display device may be built using a cathode ray tube (CRT) monitor, a liquid crystal display, or any other suitable display system. The input data signals to the display devices 1028 are typically generated by scanning out the contents of one or more frames of image data that is stored in the frame buffer 1008.

Asymmetric DBI utilizes a different DBI scheme for both sides of a link. For example, the non-table-based energy-based DBI scheme may be used by a GPU when it is transmitting data, while the level-based DBI scheme could be used by the memory when transmitting data. In general, the GDDR-type memory (for example) is less-sensitive to power-supply noise than the GPU. Thus, it may be desirable to implement a simpler DBI mechanism in the GDDR, while supporting a more sophisticated scheme in the GPU. Each side merely has to know how to decode the data from the sender.

For memory controllers that do not implement DBI, if the memory provides metadata storage (e.g., for error-correcting code (ECC) or other uses), the DBI may be performed only by the GPU or other sender, and the DBI metadata may be stored in the memory itself. The memory controller may not compute or understand the DBI mechanism. Such so-called Memory-Unaware DBI may be utilized when a DBI decoder is too complex for implementation in the memory controller.

Hybrid DBI may be utilized when different scenarios would benefit from different DBI schemes. For example, a laptop or smartphone running on battery power may operate the memory interface at a lower data rate, and thus benefit from a DBI scheme that minimizes average power consumption. This same device, plugged into a charging station, may operate at higher frequencies and benefit from a DBI mechanism that minimizes power noise. The DBI scheme utilized at a particular time by the device may be changed with a configuration register or signal that is responsive to the power source of the device. In a table-based encoding and/or decoding implementation, the technique can adjusted by dynamically modifying the values in the table. In threshold-based DBI mechanisms the policy can be adjusted by configuring whether substitution occurs if greater or less than a configured threshold and/or by adjusting the configured threshold value(s). The policy could also be adjusted by selecting from among different DBI encoders. The policy may be selected based on the desire to optimize one or more device characteristics, such as power consumption or noise reduction. The policy may for example be selected based on one or more of the following: differences in reliability requirements for applications or use-cases, differences in power requirements for different applications or use-cases, and differences in the measured error rates or power noise. Hybrid DBI may combined with asymmetric DBI in which the policy may be independently selected for the transmitter on each end of an interface. Hybrid DBI may be combined with Memory-Unaware DBI if additional metadata stored with the data specifies the policy used to encode the data.

The disclose DBI schemes may be applied beyond PAM-4. The challenges that come from transmitting multiple symbols and their non-linear current characteristics also exist for PAM-N (e.g., PAM-8, PAM-16, etc). Therefore, all the mechanisms introduced herein may be applied to a PAM-N I/O interface. For example, applying level-based DBI on PAM-8 signaling results in a change in the threshold for swapping levels for the data and utilizes a substitution scheme such as 7 dV<-->0 dV, 6 dV<-->1 dV, etc.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Firmware" refers to software logic embodied as processor-executable instructions stored in read-only memories or media.

"Hardware" refers to logic embodied as analog or digital circuitry.

"Logic" refers to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Software" refers to logic implemented as processor-executable instructions in a machine memory (e.g. read/write volatile or nonvolatile memory or media).

Those skilled in the art will appreciate that logic may be distributed throughout one or more devices or components, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method comprising:
   configuring a threshold sum condition;
   generating a sum of voltage transition values between (a) previous symbols sent concurrently in a same transmission interval over a plurality of data lanes of a serial data bus, and (b) current symbols to send concurrently over the data lanes;
   comparing the sum to the threshold sum condition; and
   in response to the sum meeting the threshold sum condition, substituting new symbols for the current symbols based on a preset substitution scheme.

2. The method of claim 1, wherein the new symbols are inverted values of the current symbols.

3. The method of claim 1, wherein the threshold sum condition is half of a maximum possible value for the sum for the plurality of data lanes.

4. The method of claim 1, further comprising setting a bit value on a data bus inversion (DBI) line indicating that the new symbols were substituted for the current symbols.

5. The method of claim 1, further comprising
   generating the new symbols from a middle region of a level-energy balanced mapping matrix.

6. A method comprising:
   receiving a plurality of original symbols to be transmitted concurrently within a same time interval across multiple data lanes of a serial data bus;
   determining a number of the original symbols that correspond to the generation of extreme voltage levels on the data line, wherein the original symbols correspond to voltage levels of $0\Delta V$, $1\Delta V$, $2\Delta V$, or $3\Delta V$, and the extreme voltage levels correspond to either $0\Delta V$ or $3\Delta V$;
   as a result of the number of the original symbols exceeding a preset number, setting a DBI line value and substituting new symbols for the original symbols, wherein the new symbols do not correspond to the generation of the extreme voltage levels; and
   transmitting the new symbols concurrently within the same time interval across the multiple data lanes.

7. The method of claim 6, wherein the original symbols comprise a most significant bit and a least significant bit and substituting the new symbols for the original symbols in the time interval comprises switching the least significant bit of the data for the original symbols.

8. The method of claim 6, wherein the original symbols comprise a most significant bit and a least significant bit and substituting the new symbols for the original symbols in the time interval comprises switching the most significant bit of the data of the original symbols.

9. The method of claim 6, wherein the DBI value is a two-bit symbol and symbols comprising a lowest voltage level utilized on the data lanes and symbols comprising a next lowest voltage level on the data lanes are swapped on condition that a number of symbols comprising the lowest voltage level exceeds a number of symbols comprising the next lowest voltage level.

10. The method of claim 9, wherein symbols comprising the lowest voltage level utilized on the data lanes correspond to 2-bit values of "00" and symbols comprising a next lowest voltage level on the data lanes correspond to 2-bit values of "01".

11. The method of claim 9, wherein symbols comprising a highest voltage level utilized on the data lanes and symbols comprising a next highest voltage level on the data lanes are swapped on condition that a number of symbols comprising the highest voltage level exceeds a number of symbols comprising the next highest voltage level.

12. The method of claim 11, wherein symbols comprising the highest voltage level utilized on the data lanes correspond to 2-bit values of "11" and symbols comprising a next highest voltage level on the data lanes correspond to 2-bit values of "10".

13. A transmitter for a serial data bus, the transmitter comprising:
    a plurality of line drivers; and
    logic to determine a sum of transition values for original symbols to be sent concurrently in a burst interval over a plurality of data lanes of the serial data bus;
    in response to the sum meeting a threshold condition, operating the line drivers to set new symbols on the serial data bus, the new symbols different than the original symbols, the new symbols derived from a middle region of an energy consumption profile for the serial data bus.

14. The transmitter of claim 13, wherein the new symbols correspond to adjacent voltage levels of the original symbols.

15. The transmitter of claim 13, wherein the threshold condition is half of a maximum possible value for the sum for the plurality of data lanes.

16. The transmitter of claim 13, further comprising a data bus inversion (DBI) line driver and logic to operate the DBI line driver to set a DBI value indicating that the new symbols were substituted for the original symbols.

17. The transmitter of claim 16, wherein the DBI value is a two-bit symbol and further comprising:
    logic to swap symbols comprising a lowest voltage level utilized on the data lanes and symbols comprising a next lowest voltage level on the data lanes on condition that a number of symbols comprising the lowest voltage level exceeds a number of symbols comprising the next lowest voltage level; and
    logic to swap symbols comprising a highest voltage level utilized on the data lanes and symbols comprising a next highest voltage level on the data lanes on condition that a number of symbols comprising the highest voltage level exceeds a number of symbols comprising the next highest voltage level.

18. The transmitter of claim 13, wherein the original symbols comprise a most significant bit and a least significant bit and substituting the new symbols for the original symbols comprises switching the least significant bit of the data for the original symbols.

19. The transmitter of claim 13, wherein the original symbols comprise a most significant bit and a least significant bit and substituting the new symbols for the original symbols comprises switching the most significant bit of the data of the original symbols.

* * * * *